(12) United States Patent
Kamimura et al.

(10) Patent No.: US 9,966,289 B2
(45) Date of Patent: May 8, 2018

(54) SUBSTRATE PROCESSING APPARATUS, METHOD FOR MANUFACTURING SEMICONDUCTOR DEVICE, AND NON-TRANSITORY COMPUTER-READABLE RECORDING MEDIUM

(71) Applicant: HITACHIT KOKUSAI ELECTRIC INC., Tokyo (JP)

(72) Inventors: Daigi Kamimura, Toyama (JP); Shigeru Odake, Toyama (JP); Tomoshi Taniyama, Toyama (JP); Takashi Nogami, Toyama (JP); Osamu Morita, Toyama (JP); Yasuaki Komae, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days. days.

(21) Appl. No.: 15/024,539

(22) PCT Filed: Sep. 19, 2014

(86) PCT No.: PCT/JP2014/074865
§ 371 (c)(1),
(2) Date: Mar. 24, 2016

(87) PCT Pub. No.: WO2015/046062
PCT Pub. Date: Apr. 2, 2015

(65) Prior Publication Data
US 2016/0247699 A1    Aug. 25, 2016

(30) Foreign Application Priority Data

Sep. 30, 2013 (JP) .................. 2013-204729

(51) Int. Cl.
*H01L 21/677* (2006.01)
*B65G 1/02* (2006.01)

(52) U.S. Cl.
CPC ........ *H01L 21/67769* (2013.01); *B65G 1/026* (2013.01)

(58) Field of Classification Search
CPC ......... H01L 21/67769; H01L 21/67772; H01L 21/67775; H01L 21/67733; H01L 21/67736; B65G 1/026; B65G 1/0457
(Continued)

(56) References Cited

U.S. PATENT DOCUMENTS 6,009,890 A    1/2000 Kaneko et al.
6,143,040 A    11/2000 Tometsuka et al.
(Continued)

FOREIGN PATENT DOCUMENTS

JP    06-329209 A    11/1994
JP    10-242232 A    9/1998
(Continued)

OTHER PUBLICATIONS

Japanese Office Action dated Sep. 15, 2016 in the Japanese Application No. 2015-539167.

*Primary Examiner* — Glenn F Myers
(74) *Attorney, Agent, or Firm* — Volpe and Koenig, P.C.

(57) ABSTRACT

An apparatus and method capable of reducing the footprint of substrate processing system. An apparatus includes a housing chamber including a housing cabinet which houses housing containers for housing substrates, and a housing container carrying mechanism provided on the ceiling of the housing chamber and configured to carry the housing containers.

10 Claims, 5 Drawing Sheets

(58) Field of Classification Search
USPC .......................................... 211/162; 414/940
See application file for complete search history.

(56) References Cited

U.S. PATENT DOCUMENTS

| | | | | |
|---|---|---|---|---|
| 8,702,365 | B2* | 4/2014 | Park | H01L 21/67769 414/217 |
| 8,827,621 | B2* | 9/2014 | Inagaki | H01L 21/67733 414/282 |
| 8,851,819 | B2* | 10/2014 | Kamikawa | H01L 21/67727 414/222.07 |
| 8,894,344 | B2* | 11/2014 | Merry | H01L 21/67769 414/281 |
| 2003/0040841 | A1 | 2/2003 | Nasr et al. | |
| 2006/0163184 | A1* | 7/2006 | Parker | A47B 53/02 211/162 |
| 2006/0213842 | A1 | 9/2006 | Shani et al. | |
| 2007/0144992 | A1* | 6/2007 | Chen | A47B 53/02 211/162 |
| 2009/0065460 | A1 | 3/2009 | Murata et al. | |
| 2010/0003111 | A1* | 1/2010 | Yeo | H01L 21/67769 414/222.07 |
| 2010/0191362 | A1 | 7/2010 | Tsukinoki | |
| 2010/0215461 | A1* | 8/2010 | Kamikawa | H01L 21/67727 414/222.13 |
| 2011/0297085 | A1 | 12/2011 | Matsuyama et al. | |

FOREIGN PATENT DOCUMENTS

| | | | |
|---|---|---|---|
| JP | 10-270530 | A | 10/1998 |
| JP | 2000-311935 | A | 11/2000 |
| JP | 2002-308442 | A | 10/2002 |
| JP | 2005-150129 | A | 6/2005 |
| JP | 2005-225598 | A | 8/2005 |
| JP | 2007-096140 | A | 4/2007 |
| JP | 2007-096145 | A | 4/2007 |
| JP | 2009-062154 | A | 3/2009 |
| JP | 2009-173396 | A | 8/2009 |
| JP | 2010-016387 | A | 1/2010 |
| JP | 2010-171276 | A | 8/2010 |
| JP | 2010-278249 | A | 12/2010 |
| JP | 2010-278254 | A | 12/2010 |
| KR | 1020100129152 | | 12/2010 |
| WO | WO-2007037397 A1 * | 4/2007 | ............ B65G 1/026 |

* cited by examiner

SUBSTRATE PROCESSING APPARATUS, METHOD FOR MANUFACTURING SEMICONDUCTOR DEVICE, AND NON-TRANSITORY COMPUTER-READABLE RECORDING MEDIUM

TECHNICAL FIELD

The present invention relates to a substrate processing apparatus, a method for manufacturing a semiconductor device, and a non-transitory computer-readable recording medium.

BACKGROUND ART

In recent years, the diameter of a processing substrate has been progressively increased, and a substrate processing apparatus for larger-diameter wafers has been developed. A footprint and substrate processing capability as in conventional apparatuses are required for the substrate processing apparatus for larger-diameter wafers. When housing containers housing a plurality of substrates therein are carried in a conventional substrate processing apparatus, a robot hand is used.

Patent Literature 1 discloses therein a structure of carrying substrate housing containers by use of a robot hand.

CITATION LIST

Patent Literature

Patent Literature 1: JP 2000-311935 A

SUMMARY OF INVENTION

A robot hand used for carrying housing containers in a conventional substrate processing apparatus as in Patent Literature 1 needs to install a transverse mechanism unit and an elevating mechanism unit in a housing container carrying region. However, the transverse mechanism unit and the elevating mechanism unit are difficult to downsize, and thus there is a problem that the carrying region increases in its size and consequently the entire substrate processing apparatus increases in its size and the constraints on the installation such as the footprint or the height of a clean room as in the conventional substrate processing apparatuses cannot be met.

The present invention provides a substrate processing apparatus capable of reducing a footprint, a method for manufacturing a semiconductor device, and a non-transitory computer-readable recording medium.

According to an aspect there is provided a substrate processing apparatus including a housing chamber including a housing cabinet which houses housing containers for housing substrates, and a housing container carrying mechanism provided on the ceiling of the housing chamber and configured to carry the housing containers.

According to the present configuration, it is possible to reduce the footprint of a substrate processing apparatus.

DESCRIPTION OF EMBODIMENTS

Figure 1:
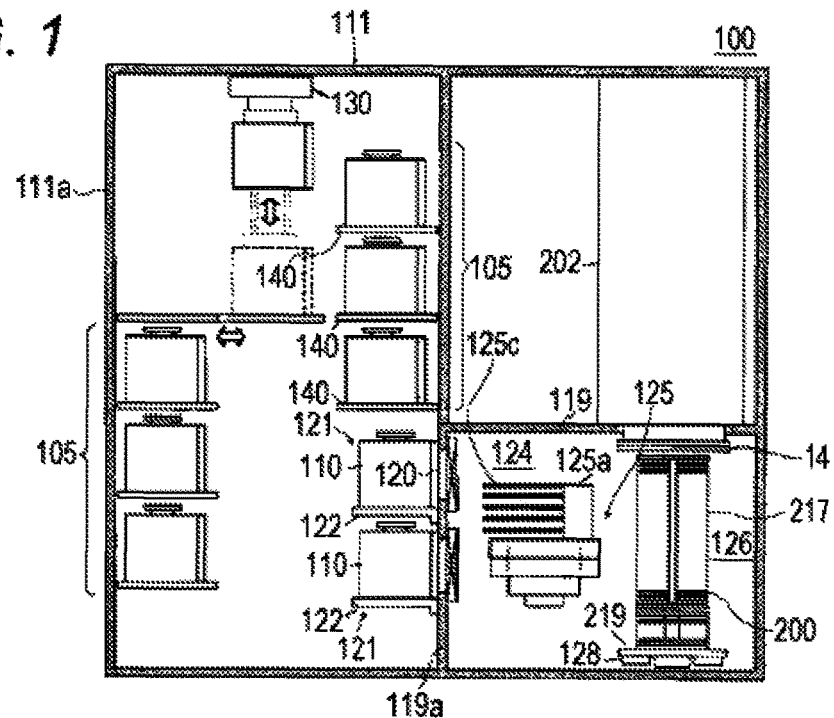
FIG. 1 is a schematic configuration diagram of a vertical processing furnace and its surrounding members used according to embodiments of the present invention, which is illustrated in a longitudinal cross-section view.

Embodiments will be described later with reference to the drawings. According to these embodiments, a substrate processing apparatus is configured to accomplish a processing apparatus in a method for manufacturing a semiconductor device (IC) by way of example. In the following description, there will be described a case in which a vertical apparatus for performing oxidization, diffusion processing, CVD processing and the like on a substrate (which will be simply denoted as processing apparatus later) is applied as the substrate processing apparatus. FIG. 1 is a longitudinal cross-section view of the substrate processing apparatus to which the present invention is applied.

As illustrated in FIG. 1, the substrate processing apparatus 100, in which hoops (which will be called pod later) 110 for housing a plurality of wafers (substrates) 200 made of silicon or the like are used as wafer carriers as housing containers, includes a casing 111 used as a substrate processing apparatus main body.

A front maintenance port (not illustrated) as an opening part provided to be maintainable is provided in front of the front wall 111a of the casing 111, and a front maintenance door for opening/closing the front maintenance port is attached.

A pod charge/discharge port is opened on the front wall 111a to communicate inside and outside the casing 111. The pod charge/discharge port may be configured to be opened/closed by a front shutter. A load port (not illustrated) used as the charge/discharge part is installed on the front of the pod charge/discharge port, and the load port is configured to be mounted with the pod 110 and aligned. The pod 110 is charged onto the load port by an in-process carrying device and is discharged from the load port.

Housing shelves (pod shelves) 105 are installed in a matrix shape vertically and horizontally around the pod charge/discharge port behind the front of the casing 111. As indicated by the arrow in FIG. 1, the pod shelves 105 are installed with placement units 140 as housing units for placing a pod thereon, respectively. The housing unit is configured of the placement unit 140, a horizontal movement mechanism (housing shelf horizontal movement mechanism) configured to horizontally move the placement unit 140 between the standby position where the pod 110 is housed and the delivery position where the pod 110 is delivered, a placement unit position sensor 142 configured to detect a position of the placement unit 140 horizontally moved by the horizontal movement mechanism, and a pod sensor 144 configured to determine the presence of a pod on the placement unit 140. The placement unit position sensor 142 detects whether the placement unit 140 is at the standby position or the delivery position, and sends placement unit position information to a controller 241 described later. The pod sensor 144 detects the presence of a pod on the placement unit 140, and sends pod placement information to the controller 241. One stage of pod shelves 105 is configured of a plurality of independent placement units 140 horizontally arranged on the same straight line, and the pod shelves are vertically installed. Each placement unit 140 can be independently and horizontally moved without being synchronized with its vertically or horizontally adjacent placement units 140 and any other placement units 140.

The pod shelves (housing shelves) 105 are installed in a matrix shape vertically and horizontally on the front side of a sub-casing 119 within the casing 111. The placement units 140 as housing units for placing a pod on each pod shelf 105 thereon are horizontally movable similarly to the pod shelves 105 behind the front of the casing 111, and can be independently and horizontally moved without being synchronized with the vertically or horizontally adjacent placement units 140. The pod shelves 105 are configured such that the pods 110 are held on the placement units 140 one by one. That is, for example, the pod shelves 105 arranges the pods 110 on the two placement units 140 one by one on the same line in the same direction, and vertically house the pods 110 in several stages.

Figure 2:
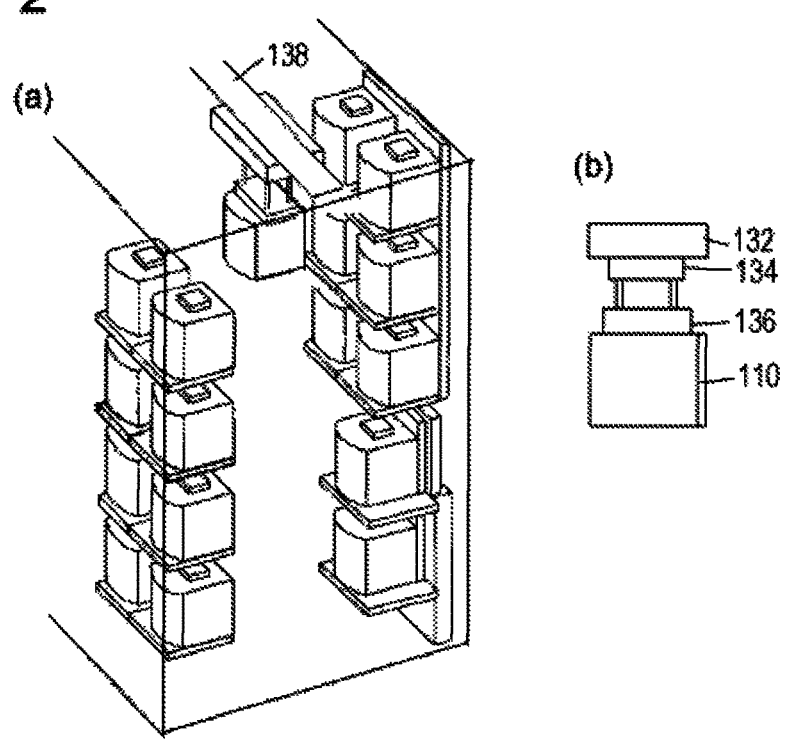
FIG. 2(a) is a perspective view of a housing chamber of FIG. 1.
FIG. 2(b) is a schematic configuration diagram of a pod carrying device in a substrate processing apparatus 100 illustrated in FIG. 1.

As illustrated in FIG. 2(a), a pod carrying region is present between the pod shelves 105 behind the front of the sub-casing 119 in the casing 111 and the pod shelves 105 on the front side of the sub-casing 119, and the pods 110 are carried and delivered in the pod carrying region. A rail mechanism 138 as a fixing part for the pod carrying mechanism is provided on the ceiling of the pod carrying region, and a traveling route is formed by the rail mechanism 138. The rail mechanism 138 is attached with a pod carrying device 130 as a movable part for the pod carrying mechanism to be travelable. The fixing part is fixed partially or entirely on the inner face of the ceiling of the casing 111. The fixing part may be configured to be partially fixed on the inner face of the casing 111 and to be apparently fixed on the inner face of the ceiling to be sandwiched. As illustrated in FIG. 2(b), the pod carrying device 130 is configured of a traveling unit 132 for traveling on the traveling route, a holding unit 136 for holding the pod 110, and an elevation unit 134 for vertically elevating the holding unit 136. The pod carrying device 130 is configured to carry the pods 110 among the load port, the pod shelves 105, and pod openers 121 in cooperation with the traveling unit 132, the elevation unit 134 and the holding unit 136. Further, the pod carrying device 130 includes a pod carrying device position sensor 138 for detecting a position of the pod carrying device and a height position sensor 139 for detecting a height position of the grip unit 136. The pod carrying position sensor 138 detects a position of the pod carrying device, and sends pod carrying position information to the controller 241. The height position sensor 139 detects a height position of the holding unit 136, and sends holding unit height position information to the controller 241. The controller 241 described later controls the movable part of the pod carrying mechanism based on the placement unit position information, the pod placement information, the pod carrying device position information, and the holding unit height information.

A pair of wafer charge/discharge ports 120 for charging/discharging a wafer 200 in/from the sub-casing 119 is opened on the front wall 119a of the sub-casing 119 vertically in two stages, and a pair of pod openers 121, 121 is installed on the wafer charge/discharge ports 120, 120 in the vertical stages, respectively. According to the present embodiment, the pod openers 121, 121 are installed vertically in two stages, but may be installed horizontally side by side. The pod openers 121 include placement tables 122, 122 for placing the pod 110 thereon, and cap attachment/detachment mechanisms 123, 123 used as sealing members for attaching/detaching a cap of the pod 110. The pod opener 121 attaches/detaches the cap of the pod 110 placed on the placement table 122 by the cap attachment/detachment mechanism 123 thereby to open/close the wafer charge/discharge port of the pod 110.

The sub-casing 119 configures a transfer chamber 124 fluidically isolated from the space where the pod carrying device 130 or the pod shelves 105 are installed. A wafer transfer mechanism 125 is installed in front of the transfer chamber 124, and the wafer transfer mechanism 125 is configured of a wafer transfer device 125a capable of horizontally rotating or directly moving the wafer 200, and a wafer transfer device elevator 125b for elevating the wafer transfer device 125a. A tweezer (substrate holding body) 125c in the wafer transfer device 125a, as a unit for placing the wafer 200 thereon, is configured to charge and discharge the wafer 200 on and from a boat (substrate holding tool) 217 by continuous operations of the wafer transfer device elevator 125b and the wafer transfer device 125a.

A standby unit 126 for housing and keeping the boat 217 is configured behind the transfer chamber 124. A processing furnace 202 used as a processing chamber is provided above the standby unit 126. The lower end of the processing furnace 202 is configured to be opened/closed by a furnace port shutter 147.

The boat 217 is elevated by a boat elevator 115 (not illustrated) and introduced into the processing furnace. A seal cap 219 as a lid is horizontally attached on an arm 128 as a coupling tool coupled to the elevating table of the boat elevator 115, and the seal cap 219 is configured to vertically support the boat 217 and to close the lower end of the processing furnace 202. The boat 217 includes a plurality of holding members, and is configured to horizontally hold a plurality of (about 25 to 125, for example) wafers 200 with their centers aligned and vertically arranged.

Figure 3:
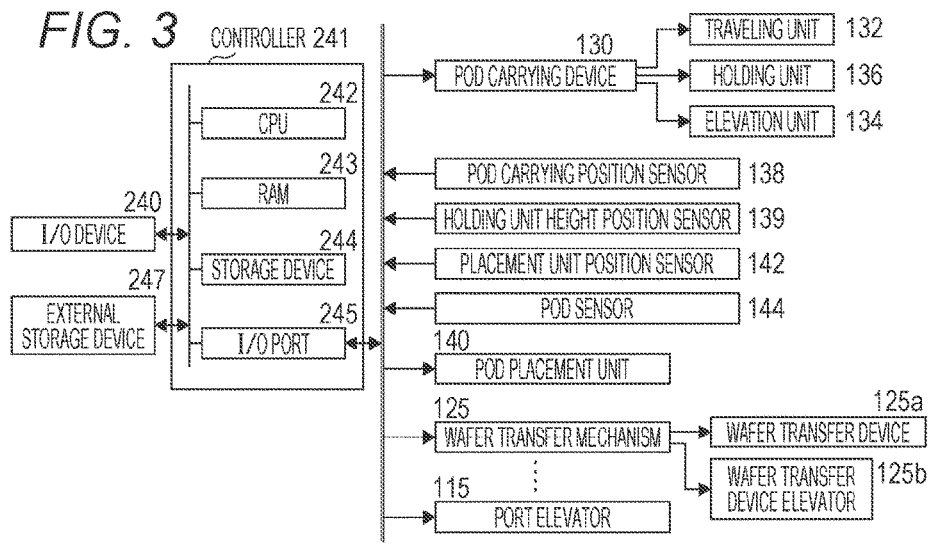
FIG. 3 is a block diagram illustrating a schematic structure of a controller in the substrate processing apparatus 100 illustrated in FIG. 1.
Figure 4:
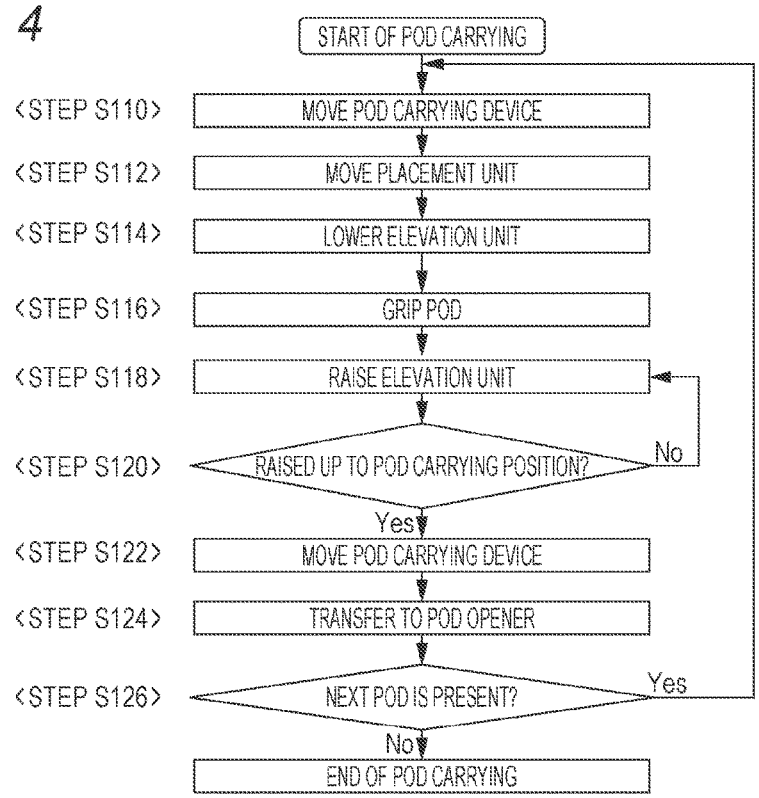
FIG. 4 is a flowchart of a first embodiment.
Figure 5:
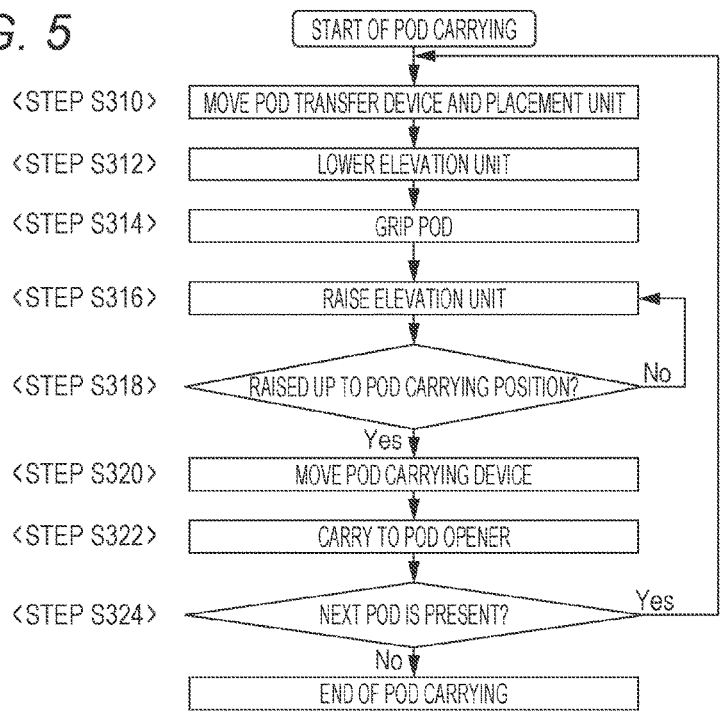
FIG. 5 is a flowchart of a second embodiment.

The operations of the substrate processing apparatus 100 will be described later. In the following description, the operation of each component configuring the substrate processing apparatus 100 is controlled by the controller 241. FIG. 3 illustrates a structure of the controller 241. The controller 241 is configured as a computer including a CPU (Central Processing Unit) 242, a RAM (Random Access Memory) 243, a storage device 244, and an I/O port 245. The RAM 243, the storage device 244, and the I/O port 245 are configured to be able to exchange data with the CPU 242 via an internal bus 246. The controller 241 is connected with an I/O device 122 configured as a touch panel, for example.

The storage device 244 is configured of a flash memory, a HDD (Hard Disk Drive), or the like, for example. The storage device 244 readably stores therein a control program for controlling the operations of the substrate processing apparatus, a process recipe describing the procedures or conditions of the substrate processing described later, and the like. The process recipe functions as a program for causing the controller 241 to perform each procedure in the substrate processing steps described later thereby to obtain a predetermined result. The process recipe, the control program and the like will be collectively and simply called program. The term program in the present specification may include only the process recipe, include only the control program, or include both of them. The RAM 243 is configured as a memory area (work area) temporarily saving therein programs, data and the like read by the CPU 242.

The I/O port 245 is connected to the pod carrying device 130, the respective sensors 138, 139, 142, and 144, the pod placement units 140, the wafer transfer mechanism 125, the boat elevator 115, and the like.

The CPU 242 is configured to read and execute the control program from the storage device 244 and to read the process recipe from a storage device 247 in response to an input operation command from an I/O device 240. The CPU 242 is configured to control the carrying operation of the pod carrying device 130, the horizontal operation of the pod placement units 140, the transfer operation of the wafer transfer mechanism 125, the elevation operation of the boat elevator 115, and the like according to the contents of the read process recipe.

The controller 241 may be configured as a general-purpose computer not limited to a dedicated computer. For example, the controller 241 according to the present embodiment can be configured by preparing an external storage device (such as magnetic tape, magnetic disk such as flexible disk or hard disk, optical disk such as CD or DVD, magnetooptical disk such as MO, or semiconductor memory such as USB memory or memory card) 147 storing the program therein and installing the program into a general-purpose computer by use of the external storage device 247. A means for supplying a computer with a program is not limited to the external storage device 247. For example, a program may be supplied by use of a communication means such as Internet or dedicated line, not via the external storage device 247. The storage device 244 or the external storage device 247 is configured as a non-transitory computer-readable recording medium. In the following, these will be collectively called non-transitory computer-readable recording medium. The term non-transitory computer-readable recording medium in the present specification may include only the storage device 244, include only the external storage device 247, or include both of them.

There will be described an example in which the substrate processing is performed as one of the steps of manufacturing a semiconductor device by use of the substrate processing apparatus. In the following description, the operation of each component configuring the substrate processing apparatus is controlled by the controller 121.

When a pod 110 is supplied to the load port, the pod 110 on the load port is charged into the casing 111 from the pod charge/discharge port by the pod carrying device. The charged pod 110 is automatically carried and delivered to the designated placement unit 140 on the pod shelf 105 by the pod carrying device 130 to be temporarily saved, and then is carried and delivered from the pod shelf 105 to one pod opener 121 to be transferred to the placement table 122 or is directly carried to the pod opener 121 to be transferred to the placement table 122. At this time, the wafer charge/discharge port 120 of the pod opener 121 is closed by the cap attachment/detachment mechanism 123 and clean air is flowed through the transfer chamber 124 thereby to prevent contaminations of the wafers due to particles in the transfer chamber or formation of a natural oxide film.

The opening side face of the pod 110 placed on the placement table 122 is pressed against the opening edge of the wafer charge/discharge port 120 on the front wall 119a of the sub-casing 119, and the cap thereof is detached by the cap attachment/detachment mechanism 123 so that the wafer charge/discharge port is opened. When the pod 110 is opened by the pod opener 121, the wafer 200 is picked up by the tweezer 125c in the wafer transfer device 125a from the pod 110 via the wafer charge/discharge port and is charged into the standby unit 126 behind the transfer chamber 124 to be charged on the boat 217. At this time, the charging may be performed after the wafer is adjusted according to a notch alignment device (not illustrated). The wafer transfer device 125a which delivers the wafer 200 to the boat 217 returns to the pod 110 and charges a next wafer 200 on the boat 217.

While a wafer is being charged onto the boat 217 by the wafer transfer mechanism 125 in one (upper or lower) pod opener 121, another pod 110 is carried and transferred from the pod shelf 105 onto the other (lower or upper) pod opener 121 by the pod carrying device 130 and the pod 110 is opened by the pod opener 121.

When a previously-designated number of wafers 200 are charged onto the boat 217, the lower end of the processing furnace 202 closed by the furnace port shutter 147 is opened by the furnace port shutter 147. Subsequently, the seal cap 219 is lifted by the boat elevator 115 so that the boat 217 holding a group of wafers 200 is charged (loaded) into the processing furnace 202.

After being loaded, the wafers 200 are subjected to any processing in the processing furnace 202. After being processed, the wafers 200 and the pods 110 are discharged outside the casing in the reverse procedure to the above processing.

A first embodiment of the present invention will be described later. The horizontal movement operations of the pod carrying device 130 and the placement units 140 in the substrate processing apparatus 100 according to the first embodiment will be described assuming that the pods 110 placed on the placement units 140 are discharged from the pod shelves 105 in order to carry the pods 110 from the pod shelves 105 to the pod openers 121. According to the first embodiment, the movement of the pod carrying device 130, and the horizontal movement of the placement units 140 to the delivery position are performed independently.

(Step S110) The traveling unit 132 is controlled to move the pod carrying device 130 above the delivery position of the placement unit 140 of the pod shelf 105 placing the pod 110 to be discharged thereon. Herein, "above the delivery position" indicates a position where the holding unit 136 is present above the end of the pod 110 to be carried, preferably a position where part of the holding unit 136 overlaps immediately on the upper end of the pod 110 to be carried, and more preferably a position where the pod carrying device 130 lowers the grip unit 136 by the elevation unit 134 to grip the pod 110 or a position where the holding unit 136 is present immediately above the pod 110.

(Step S112) It is confirmed that the pod carrying device 130 is standing by above the delivery position, and the placement unit 140 of the pod shelf 105 placing the pod 110 to be carried thereon is slid to the delivery position. Whether the pod carrying device 130 is standing by above the delivery position is determined based on the pod carrying position information detected by the pod carrying position sensor 138.

(Step S114) It is confirmed that the placement unit 140 is slid to the delivery position, and the elevation unit 134 is controlled to lower the holding unit 136 to a position to hold the pod 110. Whether the placement unit 140 is slid to the delivery position is determined based on the placement unit position information detected by the placement unit position sensor 142. The holding unit 136 is controlled to be lowered to a position to hold the pod 110 based on the holding unit height information detected by the holding unit height position sensor 139.

(Step S116) The holding unit 136 is controlled to hold the pod 110.

(Step S118) It is confirmed that the holding unit 136 holds the pod 110, and the elevation unit 134 is controlled to lift the holding unit 136.

(Step S120) A determination is made as to whether the held pod 110 is lifted to the pod carrying position, and if lifted, the processing proceeds to step S122. Herein, the pod carrying position (a height of the pod 110 when carrying the pod 110) may be a position where the pod 110 can be safely carried (a position not interfering with a pod housed in other housing shelf). Whether the held pod 110 is lifted to the pod carrying position is determined based on the holding unit height information detected by the holding unit height position sensor 138.

(Step S122) The traveling unit 132 is controlled to travel and keep the pod carrying device 130 above the placement table of the pod opener.

(Step S124) It is confirmed that the pod carrying device 130 is standing by above the placement table of the pod opener, the elevation unit 134 is controlled to lower the elevation unit to a position where the pod 110 can be placed on the placement unit, and the holding unit 136 is controlled to place the pod 110 on the placement table of the pod opener. Whether the pod carrying device 130 is standing by above the placement table is determined based on the pod carrying position information detected by the pod carrying position sensor 138. The subsequent pod placement operation is performed by controlling each sensor and detecting each item of position information similarly as in (Step S114).

(Step S126) When a pod 110 to be carried next is placed on the pod shelf 105, the processing returns to step S110, and when it is not present, pod carrying is terminated.

The pods 110 are carried by the operations in (step S110) to (step S126). There has been described above the case in which the pod carrying device 130 is moved and then the placement units 140 are moved, but the pod carrying device 130 may be moved after the placement units 140 are moved. Further, the pod 110 may be lifted to a height to discharge from the placement unit 140, and then carried without lifting the pod 110 to the pod carrying position in (step S120). Herein, a height to discharge is a height where the lower face of the pod 110 is separated from the upper face of the placement unit 140 placing the pod 110 thereon and can be safely moved. Thereby, it is possible to reduce a time to lift the pod 110 to the pod carrying position, which contributes to a reduction in carrying time. More preferably, it is better to lift a pod to a height to discharge, and to perform the elevation operation to a height to place on the placement unit at a carrying destination while the pod carrying device is moving. For example, when the placement unit at a carrying destination is higher than the placement unit before carriage, if the height before carriage is kept during carriage, the elevation unit can collide with the placement unit or the pod can collide with the elevation unit or the placement unit, but if the elevation operation to a height to place on the placement unit at a carriage destination is performed while the pod carrying device is moving, the pod is positioned above the placement unit when arriving at the placement unit at the carriage destination, thereby preventing a collision.

According to the first embodiment, at least one operational effect among the following operational effects is obtained. 1. The pod carrying device 130 is provided on the ceiling of the substrate processing apparatus thereby to reduce a footprint as compared with conventional apparatuses. A transverse mechanism unit such as conventional robot hand used for carrying pods, and an elevation mechanism unit do not need to be installed in the pod carrying region, and the installation area therefor can be accordingly reduced and the area of the carrying region can be reduced. An improvement in throughput and a reduction in turnaround time are achieved. 2. When the robot hand as a conventional technique is downsized in order to achieve a reduction in footprint, the structure is made complicated or cost is higher, but the pod carrying mechanism is provided on the ceiling as in the present invention, thereby reducing a footprint without making the structure complicated or increasing cost. Particles easily occur due to the complicated structure, but the particles can be restricted in a simple structure including the rail mechanism and the pod carrying device provided on the ceiling. 3. The placement unit 140 of the pod shelf 105 is provided with the horizontal movement mechanism, thereby increasing the number of pods 110 to be housed. When the flange over the pod 110 is held or when the lower part of the pod 110 is held, the robot hand needs to be inserted between the pod shelves 105 for carrying the pods 110 by the conventional robot hand, and thus a space where the robot hand can be inserted between the upper and lower pod shelves 105 needs to be provided. The placement unit 140 of the pod shelf 105 is in the horizontal movement mechanism so that the space does not need to be provided and the distance between the upper and lower pods can be reduced, thereby increasing the number of pods 110 to be housed. In particular, this is effective when the number of pods to be housed is increased while the substrate processing apparatus is prevented from being increased in its size. 4. The movement of the pod carrying device and the horizontal movement of the pod placement units are performed independently, thereby safely carrying the pods without a collision between the pod carrying device and the pod placement unit or setting a complicated interlock.

A second embodiment of the present invention will be described later. The present embodiment is different from the first embodiment in that the movement of the pod carrying device 130 or the elevation operation of the elevation unit 134 is performed at the same time with the horizontal movement of the placement unit 140 to the delivery position. The difference will be described later.

(Step S310) The placement unit 140 of the pod shelf 105 where the pod 110 to be discharged is placed is slid to the delivery position. While the placement unit 140 is being slid, the traveling unit 132 is controlled to travel and move the pod carrying device 130 above the delivery position.

(Step S312) It is then confirmed that the placement unit 140 is slid to the delivery position and the pod carrying device 130 is positioned above the delivery position, and then the elevation unit 134 is controlled to lower the holding unit 136 to a position to hold the pod 110. Whether the pod carrying device 130 is standing by above the delivery position is determined based on the pod carrying position information detected by the pod carrying position sensor 138. Whether the placement unit 140 is slid to the delivery position is determined based on the placement unit position information detected by the placement unit position sensor 142. Further, the holding unit 136 is controlled to lower to a position to hold the pod 110 based on the holding unit height information detected by the holding unit height position sensor 139.

(Step S314) The holding unit 136 is controlled to hold the pod 110.

(Step S316) It is confirmed that the holding unit 136 holds the pod 110, and the elevation unit 134 is controlled to lift the holding unit 136.

(Step S318) A determination is made as to whether the held pod 110 is lifted to the pod carrying position, if lifted, the processing proceeds to step S320. Whether the held pod 110 is lifted to the pod carrying position is determined based on the holding unit height information detected by the holding unit height position sensor 138.

(Step S320) The traveling unit 132 is controlled to travel the pod carrying device 130 above the placement table of the pod opener.

(Step S322) It is confirmed that the pod carrying device 130 is standing by above the placement table of the pod opener, the elevation unit 134 is controlled to lower the elevation unit to a position where the pod 110 can be placed on the placement unit, and the holding unit 136 is controlled to place the pod 110 on the placement table of the pod opener. Whether the pod carrying device 130 is standing by above the placement table is determined based on the pod carrying position information detected by the pod carrying position sensor 138.

(Step S324) When a pod 110 to be discharged next is present on the pod shelf 105, the processing returns to step S310, and if not present, pod carrying is terminated.

The pods 110 are carried by the operations in (step S310) to (step S324). There has been described above the example in which the placement units 140 are moved while the pod carrying device 130 is being moved, but the placement units 140 may be moved while the pod carrying device 130 is operating, such as during the elevation operation of the elevation unit 134. Thereby, the elevation unit and the placement units operate in parallel at the same time, which contributes to a reduction in carrying time. More preferably, the operation of the placement units 140 may start while the elevation unit is lifting. When the placement unit 140 operates while the elevation unit is lowering, a collision between the elevation unit and the placement unit or a collision between the pod and the elevation unit or the placement unit is more likely, but it is preferable that the placement unit 140 starts operating while the elevation unit is lifting. A different placement unit 140 from the placement unit 140 placing the held pod 110 thereon may be moved while the holding unit 136 is holding or the elevation unit 134 is elevating. Thereby, another placement unit can be moved to be ready to carry a pod to be carried next, which contributes to a reduction in carrying time. More preferably, another placement unit is assumed not to be overlapped on the placement unit being carried in the vertically direction. When a placement unit overlapping on the placement unit being carried in the vertical direction is moved, a collision between the elevation unit and the placement unit or a collision between the pod and the elevation unit or the placement unit is more likely, but a placement unit at a non-overlapping position can safely carry without a possible collision.

According to the second embodiment, at least one operational effect among the following operational effects can be obtained. 1. The movement of the pod carrying device or the elevation operation of the elevation unit is performed at the same time with the horizontal movement of the placement units to the delivery position so that the step of horizontally moving the placement unit after the pod carrying device is moved can be omitted, thereby reducing a time to carry the pods and improving throughput. 2. Since the pod carrying position does not interfere with a pod housed in other housing shelf, even if the placement unit is horizontally moved while the pod carrying device is moving, it cannot collide with the pod carrying device and can safely carry without complicated interlock setting.

A third embodiment of the present invention will be described later. The present embodiment is different from the first embodiment in that the rail mechanism 138 is branched at any positions and the pod carrying device can move not only horizontally but also back and forth. A structure of the housing chamber in the substrate processing apparatus 100 in which the pod carrying device can move back and forth and horizontally will be described later. A method for carrying a pod by the pod carrying device is the same as in the first or second embodiment.

Figure 6:
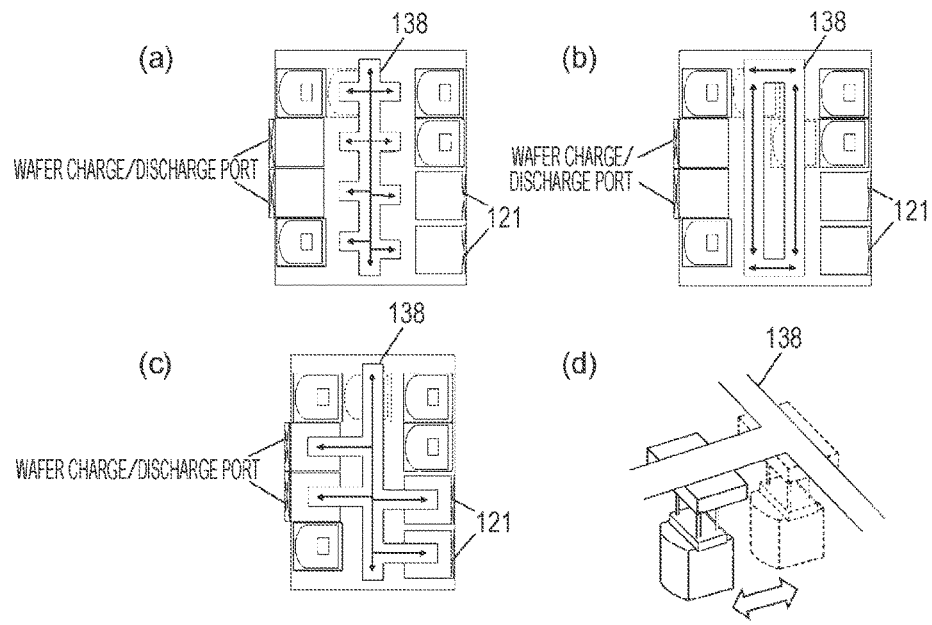
FIG. 6(a) is a top view illustrating a traveling route in the housing chamber in which branches to each delivery position are formed.
FIG. 6(b) is a top view illustrating a traveling route in the housing chamber in which a rectangular traveling route is formed.
FIG. 6(c) is a top view illustrating a traveling route in the housing chamber in which branches to delivery positions of a load port and pod openers are formed.

As illustrated in FIGS. 6 (*a*), 6 (*b*), and 6 (*c*), the rail mechanism 138 is branched at any positions and the pod carrying device 130 can switch its traveling direction at the branch points back and forth and horizontally. FIGS. 6 (*a*) and 6 (*c*) illustrate exemplary traveling routes when the horizontal movement mechanism is installed in all the pod placement tables of the placement units 140, the load port and the pod openers 121. In FIG. 6(*a*), the horizontal traveling route provided on the middle is assumed as a main route, and is formed with branch points back and forth each time the delivery position of each pod placement table of each placement unit 140, the load port and the pod opener 121 is accessed. In FIG. 6(*b*), the horizontal traveling routes are formed in parallel at the delivery positions between the placement unit 140 of the pod shelf 105 behind the front of the sub-casing 119 in the casing 111 and the pod placement unit of the load port, and the delivery position between the placement unit 140 of the pod shelf 105 in front of the sub-casing 119 and the pod placement unit of the pod opener 121, and the back and forth traveling routes are formed at the ends of each traveling route thereby to form a rectangular traveling route. FIG. 6(*c*) illustrates an exemplary traveling route when the horizontal movement mechanism is installed in each placement unit 140 but the horizontal movement mechanism is not installed at the pod placement units of the load port and the pod openers 121. For example, the lower region of the rail mechanism 138 provided on the middle is assumed as a delivery position when the placement unit 140 is horizontally moved by the horizontal movement mechanism thereby to deliver the pod 110. The back and forth branch points of the rail mechanism 138 are formed to the load port or the pod openers 110 not installed with the horizontal movement mechanism in order to access each pod placement table at the delivery position.

As illustrated in FIG. 6(*d*), the orientation of the front of the pod carrying device 130 is configured to remain unchanged even if its traveling direction changes at a branch point. By doing so, the orientation of the front of a pod 110 to be carried can be in the same orientation at any stage of the carrying. The orientation of a pod 110 may be in the same orientation as it is placed on the load port and the pod opener.

According to the third embodiment, at least one operational effect among the following operational effects can be obtained. 1. Branch points are provided not only horizontally but also back and forth so that one pod carrying device 130 can access the delivery positions of all of the placement units and the placement tables. Therefore, an increase in cost can be prevented without a complicated carrying mechanism. 2. The orientation of the front of the pod carrying device 130 does not change even if its traveling direction changes at a branch point so that the pod 110 can be carried with its lid faced toward the sub-casing 119 and the pod 110 can be smoothly carried without the step of rotating it to be placed in a proper direction when the pod 110 is placed on the placement unit 140 or the pod opener 110.

A fourth embodiment of the present invention will be described later. The present embodiment is different from the first embodiment in that pods are carried in the substrate processing apparatus in which two or more processing furnaces 202 for processing substrates are installed. A case with two processing furnaces 202 will be described later. The structure of the housing chamber or the method for carrying a pod by the pod carrying device is the same as in the first or second embodiment.

Figure 7:
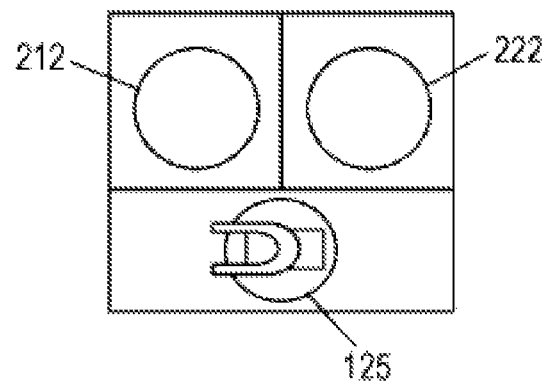
FIG. 7 is a schematic configuration diagram of the substrate processing apparatus 100 according to a fourth embodiment, which is illustrated in a transverse cross-section view.

As illustrated in FIG. 7, two processing furnaces 212 and 222 for processing wafers 200 are configured in the substrate processing apparatus 100. With the same carrying method as in the first embodiment or the second embodiment, a pod 110 is carried to the pod opener 121 and a wafer 200 is charged on the boat 217 to be charged into the processing furnace 212. When a previously-designated number of wafers 200 are charged on the boat 217, the lower end of the processing furnace 202 closed by the furnace port shutter 147 is opened by the furnace port shutter 147. Subsequently, the seal cap 219 is lifted by the boat elevator 115 so that the boat 217 holding a group of wafers 200 is charged (loaded) into the processing furnace 202 and the wafers 200 are subjected to any processing in the processing furnace 212.

A pod 110 is carried to the pod opener 121 and the wafers 200 are charged on the boat 217 to be charged into the processing furnace 222 with the same carrying method as in the first embodiment or the second embodiment while the group of wafers 200 is being processed in the processing furnace 212. While one processing furnace is processing, a group of unprocessed wafers 200 is charged into the other processing furnace in order to discharge the group of processed wafers 200 and to prepare a next processing in the other processing furnace.

According to the fourth embodiment, while one processing furnace is processing, the processed wafers 200 are discharged from the other processing furnace and the wafers 200 to be processed next are charged therein so that alternately continuous processing can be performed in the two processing furnaces, thereby improving throughput.

In the first to fourth embodiments, the pod carrying position (a height of the pod 110 held in the holding unit 136 when carrying the pod 110) may be a position to safely carry the pod 110 (a position not interfering with a pod housed in other housing shelf). A position not interfering with a pod housed in other housing shelf is, for example, where the lowermost face of the pod 110 to be carried is higher than the uppermost face of the pod 110 housed on the uppermost shelf of the housing shelves 105. For example, if the lowermost face of the pod 110 to be carried is lower than the uppermost face of the pod 110 housed on the uppermost shelf of the housing shelves 105 and higher than the lowermost face of the pod 110 housed on the uppermost shelf of the housing shelves 105, the device height can be made much lower. In this case, the placement unit on the uppermost shelf is controlled not to be horizontally moved during carriage, thereby safely carrying without an interference between the pod being carried and the pod housed on the uppermost shelf. Additionally, the upper part of the pod 110 housed on the uppermost shelf of the housing shelves 105 may overlap on the lower part of the pod 110 to be carried in their heights.

There has been described in detail the case in which the pods 110 are temporarily stored on the pod shelves 105 and discharged from the pod shelves 105 to be carried to the pod openers 121, and the example may be applied when the pods 110 are charged from the load port 114 to the pod shelves 105 or carried from a pod shelf to other pod shelf, and in the reverse operation thereto.

In FIG. 1, the pod shelves 105 behind the casing 111 are as high as the pod shelves 105 in front of the sub-casing 119, but as illustrated in FIG. 7, the pods 110 housed in the pod shelves 105 may not be at the same height, and may be as high as they partially overlap. Each line of the pod shelves 105 does not have the same number of stages, and may have a different number of stages, such as four stages on the first line and three stages on the second line. The height of each stage may be different per line or per stage. A movable pod rack may be installed in the space under the pod carrying region. Thereby, a variety of operations can be coped with.

Figure 9:
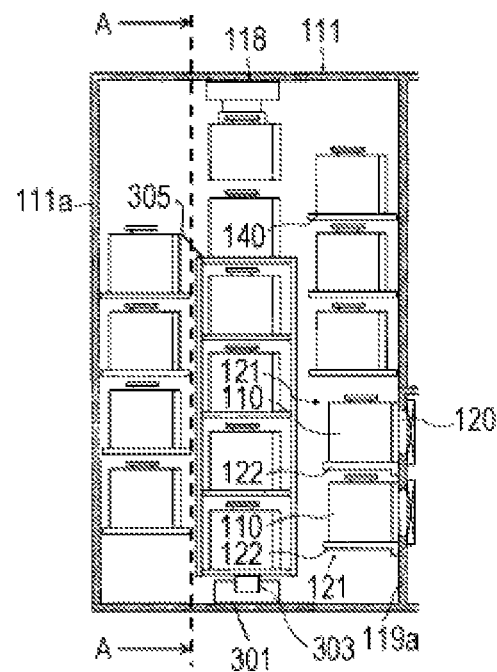
FIG. 9 is a longitudinal cross-section view of the housing chamber in which a movable housing cabinet is installed.
Figure 10:
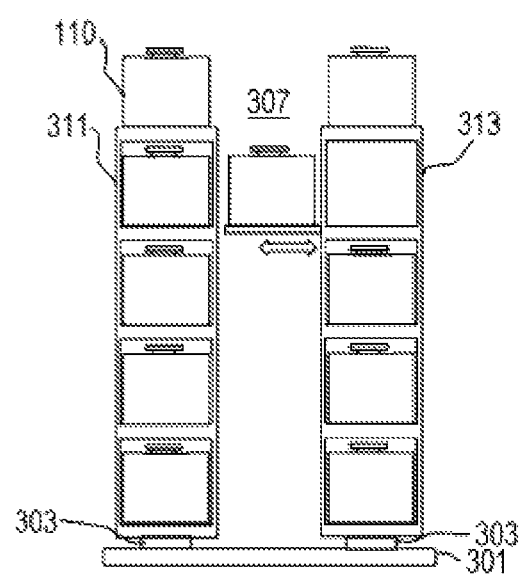
FIG. 10 is a cross-section view taken along the line A-A of FIG. 9.

FIGS. 9 and 10 illustrate the examples in which a movable housing cabinet is installed in the space under the pod carrying region. As illustrated in FIG. 9, a rack rail 301 is installed under the traveling route or on the floor under the pod carrying region. A rack 305 has a plurality of shelves capable of vertically housing a plurality of pods 110. Each stage has a structure in which the pods 110 are horizontally movable similarly as the pod shelves 105, and each stage is horizontally slid when delivering the pod 110. A rack drive unit 303 traveling on the rack rail 301 is connected to the bottom of the rack 305. The movable housing cabinet is configured of the rack rail 301, the rack drive unit 303, and the rack 305. The horizontal movement mechanism of each stage in the rack 350 and each operation of the rack drive unit 303 are controlled by the controller 241. The movable housing cabinet is configured to be able to be installed in and removed from the substrate processing apparatus 100 depending on a change in the number of housed pods.

As illustrated in FIG. 10, two racks, a first rack 311 and a second rack 313 are installed in the present example. The rack rail 301 horizontally extends on the floor under the pod carrying region to be installed, and the racks 311 and 313 are horizontally movable on the rack rail 301. The racks 311 and 313 horizontally move thereby to form a delivery space 307 of the pods 110 for delivering the pods at the delivery position. For example, when the pod 110 placed on the second stage from the top of the second rack 313 is carried, the pod placement unit is slid leftward toward the delivery space 370. When the pod 110 is delivered to the pod shelf 105, the racks 311 and 313 are horizontally moved to form the delivery space 370 in front of the placement unit 140 for delivery.

In this way, the movable housing cabinet is installed under the pod carrying region so that the number of housed pods can be changed depending on an increase/decrease in the number of substrates to be processed in the substrate processing apparatus 100. The movable housing cabinet can be installed and removed depending on a change in the number of housed pods.

Figure 8:
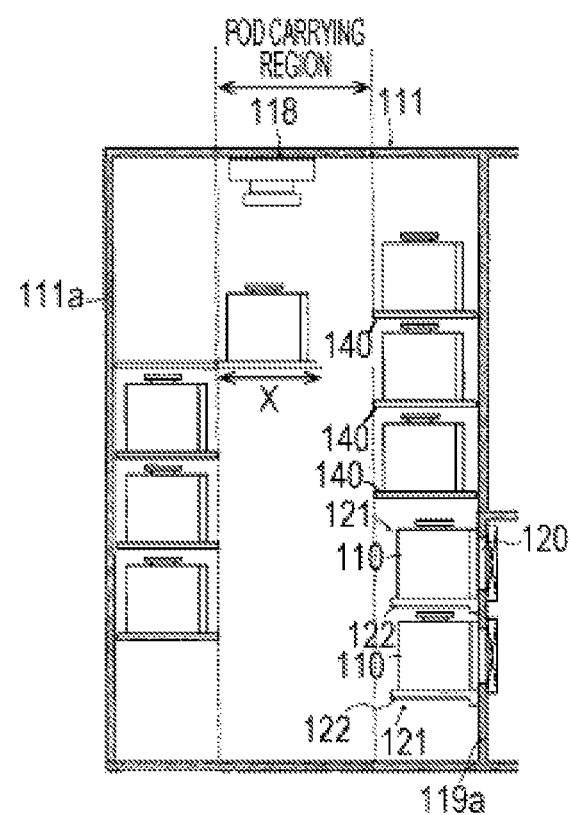
FIG. 8 is a longitudinal cross-section view of a sub-casing in the substrate processing apparatus 100 illustrated in FIG. 1 according to other embodiment.

As illustrated in FIG. 8, when the maximum amount of horizontal movement when the placement unit 140 delivers a pod is assumed as X and a width of the pod carrying region is assumed as Y, the width of the pod carrying region may be as much as the placement unit 140 can horizontally move in safety. For example, when the placement unit 140 is horizontally moved by the maximum amount X such that the horizontally-moved placement unit 140 does not collide with the opposing housing cabinet, a gap is formed between the tip end of the placement unit 140 and the opposing housing cabinet. At this time, the width Y of the pod carrying region is at X<Y. Further, for example, a gap is formed between the tip ends of the placement units 140 such that they do not collide with each other when the placement units 140 in the opposing housing cabinet are horizontally moved by the maximum amount X, respectively. At this time, the width Y of the pod carrying region is at 2X<Y. When the width Y of the carrying region is assumed at 3X or more, the drive region of the pod carrying device 118 is wider, it takes more time to carry, and the installation area of the housing chamber increases, and thus the width Y of the carrying region is preferably smaller than 3X. That is, the width Y of the carrying region is configured at X<Y<3X.

The placement units 140 horizontally arranged on the same line may be coupled with each other, not independently. That is, the placement unit 140 is assumed as one shelf in which a plurality of pods, such as three pods, are horizontally placed on a line, and the shelves may be horizontally moved one by one. The placement units 140 capable of placing a plurality of pods thereon and the placement units 140 capable of placing only one pod thereon may be present together. With the structure, the apparatus specification can be optimized. A plurality of pods can be placed thereby to decrease the number of horizontal movement mechanisms, which can cause a decrease in the number of components.

The film-forming processing performed in the substrate processing apparatus 100 may be CVD, PVD, ALD, Epi, a processing of forming oxide film or nitride film, or a processing of forming a metal-containing film. Further, the processing may be annealing processing, oxidization processing, diffusion processing, and the like.

The preferred embodiments of the present invention will be described later.

(Note 1) According to an aspect of the present invention, there is provided a substrate processing apparatus including a housing chamber including a housing cabinet which houses housing containers for housing substrates, and a housing container carrying mechanism provided on the ceiling of the housing chamber and configured to carry the housing containers.

(Note 2) The substrate processing apparatus according to note 1, wherein preferably the housing cabinet includes horizontally-movable placement units for placing the housing containers thereon.

(Note 3) The substrate processing apparatus according to note 2, wherein preferably the placement unit horizontally moves between a standby position to house the housing container and a delivery position to deliver the housing container to the housing container carrying mechanism.

(Note 4) The substrate processing apparatus according to any one of notes 1 to 3, wherein preferably the housing container carrying mechanism includes a traveling route provided on the ceiling and a movable part moving along the traveling route.

(Note 5) The substrate processing apparatus according to note 4, wherein preferably the movable part includes a holding unit for holding the housing container, and an elevation unit for elevating the holding unit.

(Note 6) The substrate processing apparatus according to note 4 or 5, preferably further including a load port for charging/discharging the housing container from outside the substrate processing apparatus, and a pod opener for opening/closing the lid of the housing container, wherein the traveling route is branched at a position to access at least either the load port or the pod opener.

(Note 7) The substrate processing apparatus according to any one of notes 2 to 6, wherein preferably the housing cabinet includes placement units capable of being horizontally moved for each housing container, and the placement units are independently and horizontally movable.

(Note 8) The substrate processing apparatus according to any one of notes 1 to 7, wherein preferably when the carrying mechanism holds and carries the housing container, the housing container is carried at a height where the top face of a housing container housed on the uppermost stage in the housing cabinet formed of a plurality of stages at least partially overlaps on the lower face of the housing container to be carried.

(Note 9) The substrate processing apparatus according to any one of notes 3 to 8, wherein preferably the placement unit is configured to horizontally move the housing container from the standby position to the delivery position, and the housing container carrying mechanism is configured to move above the delivery position during the horizontal movement.

(Note 10) The substrate processing apparatus according to any one of notes 1 to 9, wherein preferably the housing container carrying mechanism carries the housing container with the same plane of the housing container faced in the traveling direction.

(Note 11) The substrate processing apparatus according to any one of notes 1 to 10, preferably further including a movable housing cabinet provided on the floor of the housing chamber and configured to house the housing containers.

(Note 12) According to another aspect of the present invention, there are provided a method for processing a substrate, a method for carrying a housing container, and a method for manufacturing a semiconductor device including a step of carrying a housing container housing a substrate therein by a housing container carrying mechanism provided on the ceiling of a substrate processing apparatus, and a step of transferring the substrate in the housing container onto a substrate holding tool and processing it in a processing chamber.

(Note 13) According to still another aspect of the present invention, there are provided a program for causing a computer to perform a procedure of carrying a housing container housing a substrate therein by a housing container carrying mechanism provided on the ceiling of a substrate processing apparatus and a processing of transferring the substrate in the housing container onto a substrate holding tool and processing it in a processing chamber, and a non-transitory computer-readable recording medium recording the program therein.

(Note 14) According to still another aspect of the present invention, there is provided a substrate processing apparatus including at least two processing chambers for processing substrates, the substrate processing apparatus including a housing chamber including a housing cabinet which houses housing containers for housing substrates therein, and a housing container carrying mechanism provided on the ceiling of the housing chamber and configured to carry the housing containers.

(Note 15) The substrate processing apparatus according to note 14, wherein preferably while one processing chamber in the at least two processing chambers is processing the substrate, a housing container housing a substrate to be processed in the other processing chamber is carried by the housing container carrying mechanism.

INDUSTRIAL APPLICABILITY

With the substrate processing apparatus, the method for manufacturing a semiconductor device, and the non-transitory computer-readable recording medium according to the present invention, it is possible to reduce a footprint.

REFERENCE SIGNS LIST

105 Pod shelf
140 Placement unit
121 Pod opener
130 Pod carrying device
241 Controller

The invention claimed is:

1. A substrate processing apparatus comprising:
   a housing of the apparatus;
   a cabinet in the housing including a plurality of vertically arranged shelves, wherein each of the plurality of vertically arranged shelves includes a lateral opening and a horizontally-movable placement unit;
   a load port charging/discharging containers between inside and outside the substrate processing apparatus;
   a container carrying mechanism provided on a ceiling of the housing inside the apparatus and configured to carry the containers within the housing, wherein the container carrying mechanism includes a traveling route provided on the ceiling, a movable part moving along the traveling route, a holding unit holding each of said containers, and an elevation unit lifting or lowering the holding unit;
   a pod opener installed separately from the cabinet, facing to a delivery space of the container carrying mechanism and opening/closing a lid of each of the containers, wherein the traveling route is branched at a position to access at least either the load port or the pod opener; and
   wherein each horizontally-movable placement unit of the plurality of shelves horizontally move between a respective standby position that houses the containers and a respective delivery position that delivers a respective the container to the container carrying mechanism, wherein in the respective standby position the container on the placement unit and other containers are vertically arranged in the cabinet and the holding unit is not able to access to above the containers, and in the respective delivery position the placement unit protrude from the shelves into the delivery space of the container carrying mechanism, both of the standby position and the delivery position are within the housing; and
   wherein delivery of each of the containers between the container carrying mechanism and the placement unit includes placing of the respective container from the container carrying mechanism onto the placement unit and catching of the the respective container from the placement unit by the holding unit with elevation operation of the container carrying mechanism.

2. The substrate processing apparatus according to claim 1, wherein the cabinet includes the placement units for each of the containers in the cabinet, and the placement units are independently and horizontally movable.

3. The substrate processing apparatus according to claim 2, wherein when the container carrying mechanism holds and carries one of the containers, the one of the containers is carried at a height where a lower face of the one of the containers is lower than a top face of an other container housed on an uppermost shelve in the cabinet and higher than a lowermost face of another container.

4. The substrate processing apparatus according to claim 1, wherein the placement unit is configured to horizontally move each of the containers from the standby position to the delivery position at same time as the container carrying mechanism moves above the delivery position of the placement unit.

5. The substrate processing apparatus according to claim 4, wherein the elevation unit of the container carrying mechanism performs the elevation operation to a height for placing the containers on placement unit of destination while the movable part is moving along the traveling route.

6. The substrate processing apparatus according to claim 1, wherein the container carrying mechanism carries each of the containers with a plane of the container faced in a traveling direction.

7. The substrate processing apparatus according to claim 1, wherein a space between a top face of each of the containers in the standby position and an upper shelf is narrower than a height needed to insert a robot hand.

8. The substrate processing apparatus according to claim 7, wherein each of the placement units comprising:
   a horizontal movement mechanism configured to horizontally move the placement unit;
   a placement position sensor configured to detect a position of the placement unit; and
   a pod sensor configured to determine a presence of one or more of the containers on the placement unit.

9. The substrate processing apparatus according to claim 1, wherein the traveling route is consisted only on straight lines.

10. The substrate processing apparatus according to claim 1, wherein the traveling route is consisted only on one straight line alongside the cabinet.

* * * * *